(12) United States Patent
Takamura et al.

(10) Patent No.: US 9,161,463 B2
(45) Date of Patent: Oct. 13, 2015

(54) ELECTRONIC COMPONENT

(75) Inventors: Naoki Takamura, Makinohara (JP); Tohru Kurosawa, Fujieda (JP)

(73) Assignee: Yazaki Corporation, Tokyo (JP)

( * ) Notice: Subject to any disclaimer, the term of this patent is extended or adjusted under 35 U.S.C. 154(b) by 424 days.

(21) Appl. No.: 13/636,723

(22) PCT Filed: Apr. 12, 2011

(86) PCT No.: PCT/JP2011/059099
§ 371 (c)(1),
(2), (4) Date: Sep. 24, 2012

(87) PCT Pub. No.: WO2011/129338
PCT Pub. Date: Oct. 20, 2011

(65) Prior Publication Data
US 2013/0010443 A1 Jan. 10, 2013

(30) Foreign Application Priority Data
Apr. 14, 2010 (JP) ................................. 2010-093347

(51) Int. Cl.
*H05K 1/14* (2006.01)
*H01R 13/514* (2006.01)
(Continued)

(52) U.S. Cl.
CPC ........ *H05K 5/0026* (2013.01); *H01L 27/14806* (2013.01); *H01R 12/721* (2013.01);
(Continued)

(58) Field of Classification Search
CPC .... H01R 12/51; H01R 12/721; H01R 13/514; H01R 13/703; H01R 43/18; H05K 5/0026; H05K 1/117; G03B 17/02; H01L 27/14

USPC ............. 361/752, 736–751; 439/752; 174/88, 174/252, 520, 526
See application file for complete search history.

(56) References Cited

U.S. PATENT DOCUMENTS 3,629,787 A * 12/1971 Wilson ........................... 439/67

FOREIGN PATENT DOCUMENTS

JP 62-123081 U 8/1987
JP 2002-367696 A 12/2002
(Continued)

OTHER PUBLICATIONS

Communication, dated Feb. 4, 2014, issued by the European Patent Office in counterpart European Patent Application No. 11768859.8.
(Continued)

*Primary Examiner* — Courtney Smith
*Assistant Examiner* — Zhengfu Feng
(74) *Attorney, Agent, or Firm* — Sughrue Mion, PLLC

(57) ABSTRACT

Disclosed is an electronic component which maintains good connection between a circuit board and connection terminals and provides size reduction. The electronic component includes a circuit board, a pair of connection terminals, and a housing with the pair of connection terminals mounted thereon. The circuit board is provided with a plurality of terminal sections connected to the connection terminals. Each connection terminal is provided with a spring member formed to be elastically deformable and which sandwich the terminal sections between them. A rib is provided in the housing, wherein the rib is provided between through-holes through which each of the pair of connection terminals pass, and whereby the rib is formed in convex shape, towards the circuit board and away from a bottom section of a substrate housing section in which the circuit board is housed, and the rib penetrates a plurality of terminal sections.

2 Claims, 7 Drawing Sheets

(51) Int. Cl.
*H05K 1/00* (2006.01)
*H01R 13/46* (2006.01)
*H01L 23/34* (2006.01)
*H05K 5/00* (2006.01)
*H01R 12/72* (2011.01)
*H01R 13/05* (2006.01)
*H04N 5/225* (2006.01)
*H01L 27/148* (2006.01)
*H05K 1/11* (2006.01)
*H01R 12/51* (2011.01)
*G03B 17/02* (2006.01)
*H01L 27/146* (2006.01)

(52) U.S. Cl.
CPC ............ *H01R 13/05* (2013.01); *H04N 5/2253* (2013.01); *H04N 5/2257* (2013.01); *H05K 1/117* (2013.01); *G03B 17/02* (2013.01); *H01L 27/14618* (2013.01); *H01L 2924/0002* (2013.01); *H01R 12/51* (2013.01); *H01R 2201/26* (2013.01); *H05K 2201/0311* (2013.01); *H05K 2201/09172* (2013.01)

(56) References Cited

FOREIGN PATENT DOCUMENTS

| | | | | |
|---|---|---|---|---|
| JP | 2002367696 A | * | 12/2002 | ............ H01R 12/18 |
| JP | 2009-099411 A | | 5/2009 | |
| KR | 10-0913922 B1 | | 8/2009 | |
| KR | 100913922 B1 | * | 8/2009 | ............ F21V 21/002 |

OTHER PUBLICATIONS

International Search Report (PCT/ISA/210) dated May 17, 2011, issued by the International Searching Authority in International Application No. PCT/JP2011/059099.

Written Opinion (PCT/ISA/237) dated May 17, 2011, issued by the International Searching Authority, in International Application No. PCT/JP2011/059099.

Communication dated Jul. 23, 2014 from the State Intellectual Property Office of P.R. China in a counterpart application No. 201180019154.X.

Communication issued Jan. 13, 2015 by the State Intellectual Property Office of P.R. of China in related application No. 201180019154.X.

* cited by examiner

ELECTRONIC COMPONENT

TECHNICAL FIELD

The invention relates to an electronic component such as CCD camera unit that is mounted on a vehicle serving as a moving object.

BACKGROUND ART

An electronic component such as CCD camera unit 101 and the like is mounted on a vehicle serving as a moving object. As shown in FIG. 11, the CCD camera unit 101 has a box-shaped first case 102 having an opening, a circuit board 104 mounted (assembled) to the first case 102, a camera lens device 106 mounted on the circuit board 104, spring members 103 mounted on an opposite side of the circuit board 104 to the camera lens device 106, a second case 105 assembled to cover the opening of the first case 102 and connection terminals 107 mounted to the second case 105 and electrically connected to the spring members 103 (for example, refer to Patent Document 1).

As shown in FIG. 12, the spring members 103 are formed to elastically deform in both directions along which the first case 102 and the second case 105 come close to each other and get away from each other, which directions are parallel with the assembling direction of the first case 102 and the second case 105. Also, the connection terminals 107 extend towards the first case 102, and when the first case 102 and the second case 105 are assembled each other, the spring members 103 elastically contact the connection terminal 107, so that the connection terminals 107 and the spring members 103 are electrically connected.

PRIOR ART DOCUMENT

Patent Documents

Patent Document 1: Japanese Patent Application Publication No. 2009-99411A

SUMMARY OF INVENTION

Problems to be Solved by Invention

However, the above CCD camera unit 101 has following problems. That is, according to the above CCD camera unit 101, even when a positional deviation from a predetermined contact point of the spring member 103 and the connection terminal 107 occurs, which is caused by a little distortion or inclination generated due to a mounting error between the first case 102 and the circuit board 104 mounted to the first case 102 or a mounting error between the first case 102 and the second case 105 mounted to the first case 102, the spring member 103 is elastically displaced (i.e., elastically deformed) to absorb the positional deviation. Therefore, it is necessary to secure a space for the elastic deformation of the spring member 103, so that the above CCD camera unit 101 tends to be larger in the direction along which the spring member 103 is elastically deformed.

Also, for example, when a positional deviation between the spring member 103 and the connection terminal 107, which cannot be absorbed by the elastic displacement (i.e., elastic deformation) of the spring member 103, is caused due to vibration and the like during a traveling of the vehicle, an amount of the elastic displacement of the spring member 103 is varied, so that it is not possible to maintain a stable contact load. Thereby, the electrical connection between the spring member 103 and the connection terminal 107 may be disconnected, so that it may be difficult to favorably maintain the connected state between the spring member 103 and the connection terminal 107.

Accordingly, the invention has been made to solve the above problems. An object of the invention is to provide a small-sized electronic component capable of favorably maintaining a connected state between a circuit board and a connection terminal to be connected to the circuit board.

Means for Solving Problems

The above object of the invention is realized by following configurations.

(1) An electronic component includes a circuit board, at least a pair of connection terminals connected to the circuit board and a housing to which the pair of connection terminals are mounted. The circuit board is provided with a plurality of terminal sections that are formed in convex shape towards the housing, provided at an interval and connected to the connection terminals. Each of the pair of connection terminals is provided with spring members that are formed to be elastically deformable in both directions along which the pair of connection terminals comes close to each other and get away from each other and that sandwich the terminal sections therebetween. The housing is provided with a substrate housing section that is disposed between through-holes through which the respective connection terminals pass and that houses the circuit board therein. The housing is provided with at least one rib that is formed in convex shape from a bottom section of the substrate housing section towards the circuit board and is introduced into the plurality of terminal sections.

(2) In the electronic component having the configuration (1), the housing is provided with a pair of contact sections that is provided to face each other in the direction along which the pair of spring members get away from each other and that sandwich the pair of spring members therebetween.

(3) In the electronic component having the configuration (1) or (2), a pair of restraint sections is provided which is formed in convex shape from the rib towards the circuit board and positions the circuit board therebetween.

MODE TO CARRY OUT INVENTION

A CCD camera unit 1, which is an electronic component according to an illustrative embodiment of the invention, will be described with reference to FIGS. 1 to 10.

Figure 1:
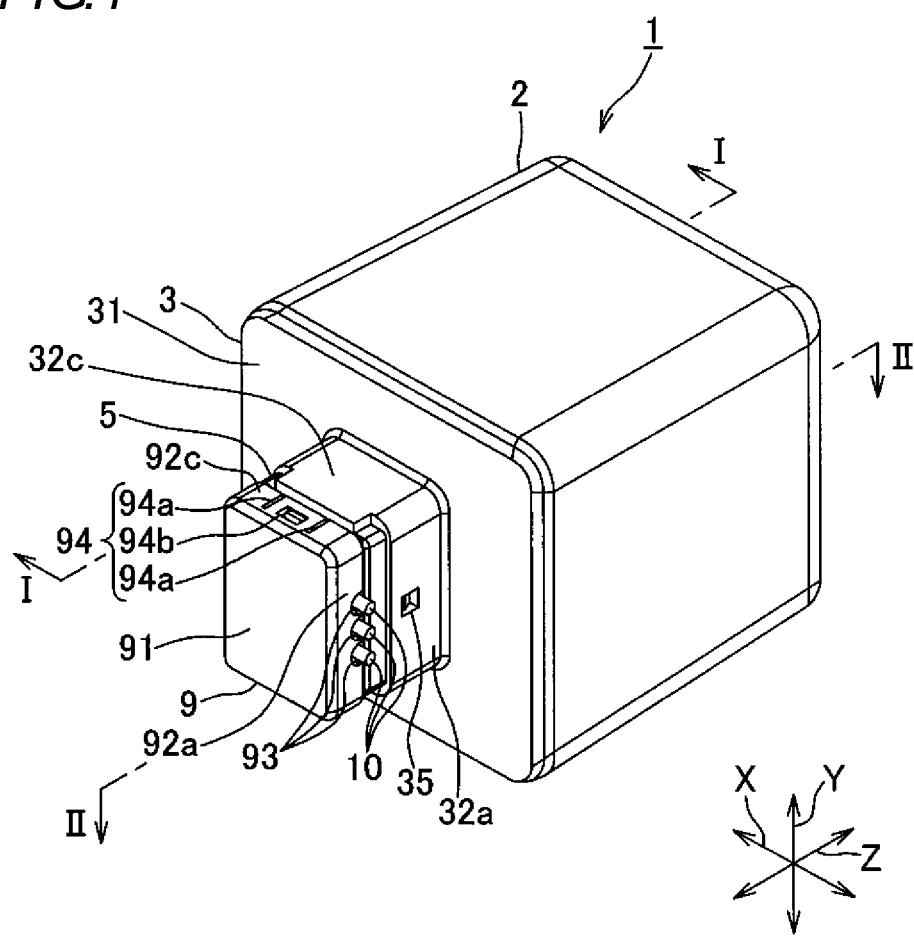
FIG. 1 is an entire perspective view of a CCD camera unit according to an illustrative embodiment of the invention.
Figure 2:
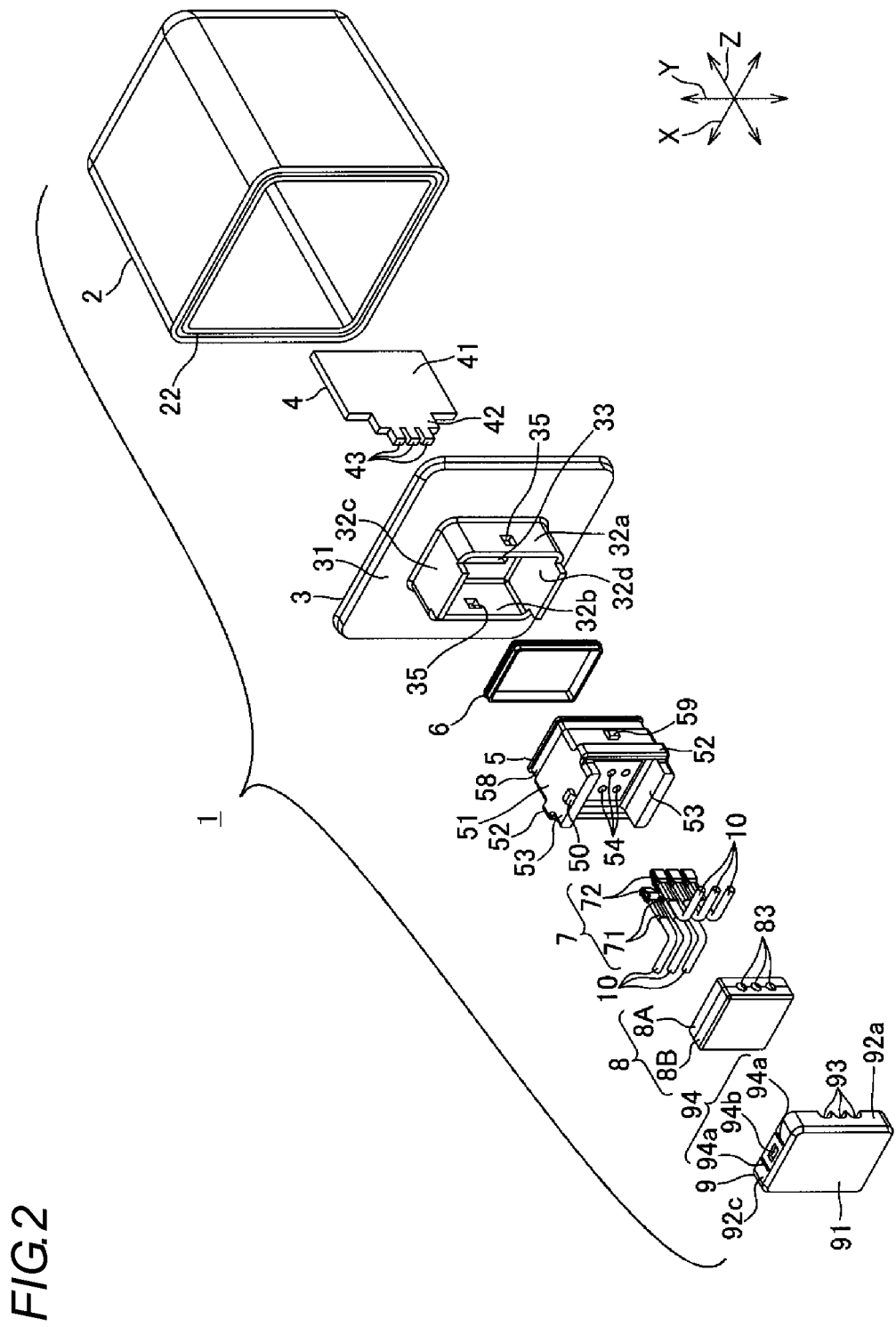
FIG. 2 is an exploded perspective view of the CCD camera unit shown in FIG. 1.

The CCD camera unit 1 shown in FIGS. 1 and 2 has a box-shaped camera case 2 having an opening, a connection connector 3 that is assembled to the camera case 2 to thus cover the opening, a circuit board 4 that is mounted to the connection connector 3, a camera lens device (not shown) that is mounted on the circuit board 4, at least one pair of (i.e., a plurality of) female terminals 7 serving as connection terminals that are connected to the circuit board 4, a female housing 5 serving as a housing that mounts the plurality of female terminals 7 thereto, a first packing 6, a second packing 8 and a rear holder 9 that is mounted to the female housing 5.

Also, an arrow Z shown in FIG. 1 and the like indicates a direction along which the circuit board 4 is introduced between the pair of female terminals 7, i.e., a direction along which the camera case 2 and the connection connector 3 are assembled. An arrow X is indicative of a direction along which a spring member 72 of the female terminal 7 is elastically deformed. An arrow Y indicates a direction intersecting (orthogonal) with both the arrow Z and the arrow X.

The camera case 2 is formed with a recess 22 into which a protrusion 34 (refer to FIG. 6 and the like) of the connection connector 3 (which will be described later) is fitted. The recess 22 has a concave section from a surface of an edge of the opening of the camera case 2 along the arrow Z direction. Also, the recess 22 is formed over an entire periphery of the edge of the camera case 2.

The connection connector 3 is made of insulating synthetic resin. Also, the connection connector 3 has a plate section 31 covering the opening of the camera case 2, and a plurality of wall sections 32a, 32b, 32c, 32d.

The plate section 31 is provided with the protrusion 34 (refer to FIG. 6) that is fitted into the recess 22 of the camera case 2, and an opening 33 to which the circuit board 4 is mounted. The opening 33 is provided at a central portion of the plate section 31 and penetrates the plate section 31. Also, the circuit board 4 is press-fitted to an inside of the opening 33, so that the circuit board 4 is mounted to the connection connector 3.

The protrusion 34 is formed in convex shape from a surface of the plate section 31 facing the camera case 2. The protrusion 34 is fitted into the recess 22 of the camera case 2, so that the connection connector 3 is mounted to the camera case 2.

The plurality of wall sections 32a, 32b, 32c, 32d is provided to stand from the plate section 31 in the arrow Z direction. Also, the plurality of wall sections 32a, 32b, 32c, 32d has a frame shape in which edges adjacent to each other continue. Also, a pair of wall sections 32a, 32b of the plurality of wall sections 32a, 32b, 32c, 32d is, which face each other in the arrow X direction, is provided with a pair of engaging sections 35 penetrating the wall sections 32a, 32b. The respective engaging sections 35 are provided at central portions of the respective wall sections 32a, 32b.

The circuit board 4 has a board main body 41, a press fitting section 42, which is provided to a side of the board main body 41 facing the connection connector 3 in the arrow Z direction and has a width narrower than the board main body 41 in the arrow Y direction, and a plurality of terminal sections 43 that is formed in convex shape from the press fitting section 42 towards the connection connector 3 in the arrow Z direction. Also, a surface of the circuit board 4 is formed with a wiring pattern 4a (refer to FIG. 10) that connects the camera lens device (not shown) and the female terminals 7 in a predetermined pattern. The wiring pattern 4a is also formed on surfaces of the respective terminal sections 43.

The press fitting section 42 is provided at a central portion of the board main body 41. Also, the press fitting section 42 is press-fitted into the opening 33 of the connection connector 3.

The plurality of terminal sections 43 is arranged at an interval in the arrow Y direction. The respective terminal sections 43 are positioned between the spring members 72 of the pair of female terminals 7, which will be described later. Also, ribs 57 of the female housing 5 serving as the housing are introduced between the plurality of terminal sections 43 provided in the arrow Y direction. Also, positions of the respective terminal sections 43 in the arrow X direction are restrained between a pair of restraint sections 57b of the female housing 5, which will be described later. Also, when the press fitting section 42 of the circuit board 4 is press-fitted to the connection connector 3, the plurality of terminal sections 43 and a part of the press fitting section 42 protrude from the plate section 31 of the connection connector 3 in the arrow Z direction.

Figure 3:
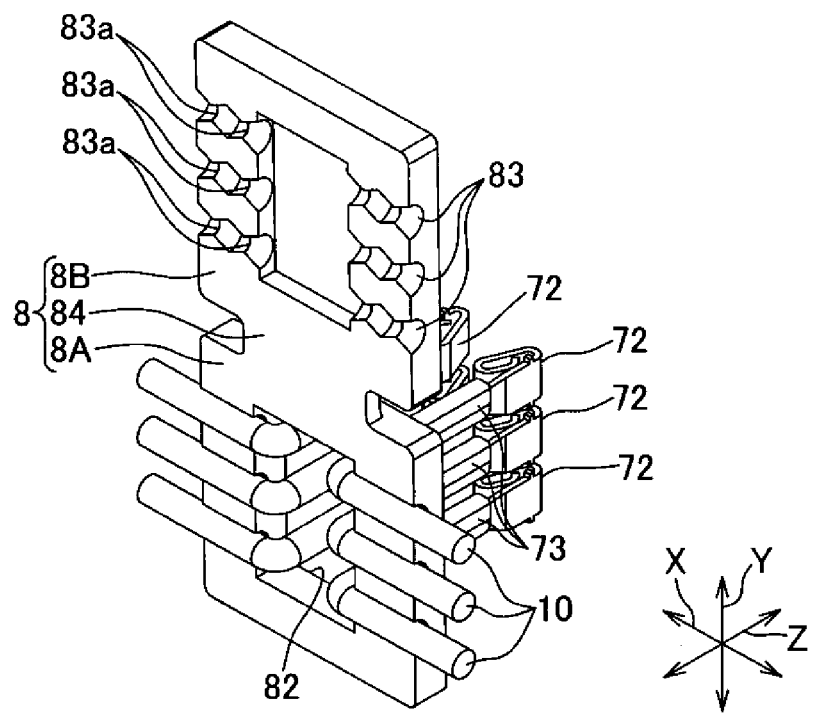
FIG. 3 is a perspective view a state where connection terminals and electric wires configuring the CCD camera unit shown in FIG. 1 are being mounted to a second packing.
Figure 4:
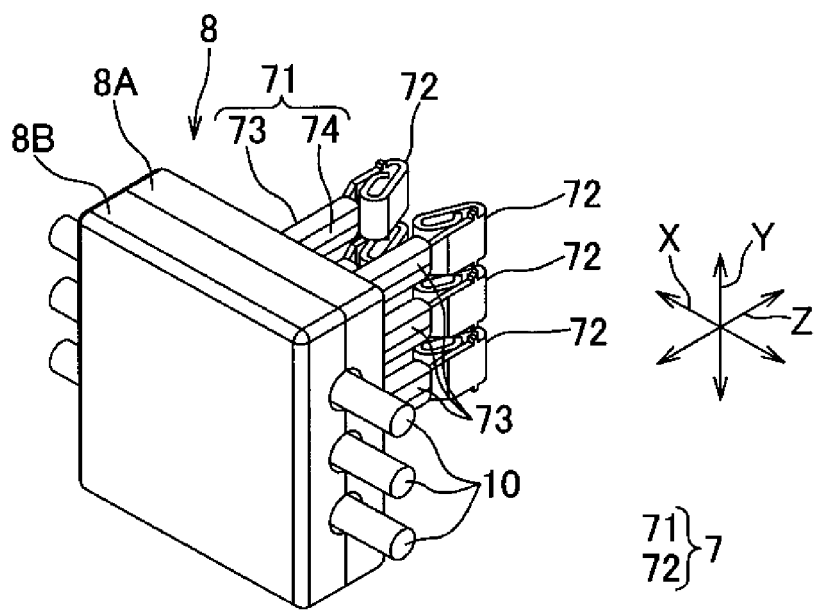
FIG. 4 is a perspective view a state where the connection terminals and the electric wires configuring the CCD camera unit shown in FIG. 1 are mounted to the second packing.

The female terminal 7 is formed by punching or bending a conductive metal plate. As shown in FIGS. 3 and 4, the female terminal 7 has integrally an electric wire connection section 71 and the spring member 72 serving as an electric contact section continuing from the electric wire connection section 71. Also, the female terminal 7 corresponds to the 'connection terminal' defined in the claims.

The electric wire connection section 71 has integrally a bottom plate 73 having a rectangular shape of a flat plate and a pair of core crimping pieces 74 provided to stand from both ends of the bottom plate 73 in a width direction (arrow Y direction). Also, a longitudinal direction (arrow Z direction) of the electric wire connection section 71 and a longitudinal direction (arrow Z direction) of an electric wire 10 connected to the electric wire connection section 71 are parallel with each other. Also, the electric wire 10 connected to the electric wire connection section 71 is bent to have an L shape and is thus held between holding sections 8A, 8B of the second packing 8, which will be described later.

The pair of core crimping pieces 74 is bent so that edges distant from the bottom plate 73 become close to the bottom plate 73. The pair of core crimping pieces 74 holds a core, which is exposed as a sheath of the electric wire 10 is stripped, between the bottom plate 73 and the core crimping pieces and thus crimps the core, so that the core crimping pieces 74 and the core of the electric wire 10 are electrically connected.

The spring member 72 continues from the bottom plate 73. Also, an end of the spring member 72, which is distant from the bottom plate 73, is spirally bent in a direction in which the respective spring members 72 provided to the pair of female terminals 7 come close to each other. Thereby, the spring member 72 is formed to be elastically deformable in the arrow X direction.

Figure 5:
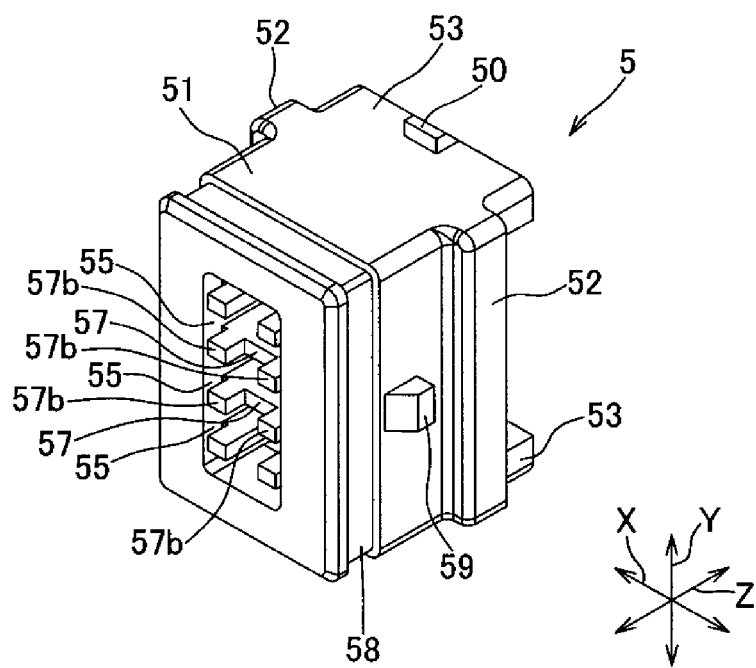
FIG. 5 is a perspective view showing a female housing configuring the CCD camera unit shown in FIG. 1.

The female housing 5 is made of insulating synthetic resin and has a substantially rectangular shape. Also, as shown in FIGS. 2 and 5, the female terminal 7 is mounted to the female housing 5 via the second packing 8. The female housing 5 having the female terminals 7 mounted thereto is mounted to the connection connector 3. When the female housing 5 is mounted to the connection connector 3, the female terminals 7 mounted to the female housing 5 and the circuit board 4 mounted to the connection connector 3 are electrically connected. The female housing 5 has a housing main body 51, a pair of protrusions 52 provided to the housing main body 51 and holder mounting sections 53 mounting a rear holder 9. Also, the female housing 5 corresponds to the 'housing' defined in the claims. In the meantime, FIG. 5 shows the female housing 5 shown in FIG. 5 from the connection connector 3.

The housing main body 51 is provided with a plurality of through-holes 54 through which the electric wires 10 and the female terminals 7 having the electric wires 10 mounted thereto pass, a plurality of contact sections 55 provided on inner surfaces of the through-holes 54, a substrate housing section 56 provided between the through-holes 54 in the arrow X direction, a plurality of ribs 57 provided between the plurality of terminal sections 43 of the circuit board 4, a first packing mounting section 58 to which the first packing 6 is mounted and a pair of sections to be engaged 59 each of which is engaged with each of the pair of engaging sections 35 of the connection connector 3. Also, the housing main body 51 is mounted between the plurality of wall sections 32a, 32b, 32c, 32d having a frame shape of the connection connector 3.

Figure 7:
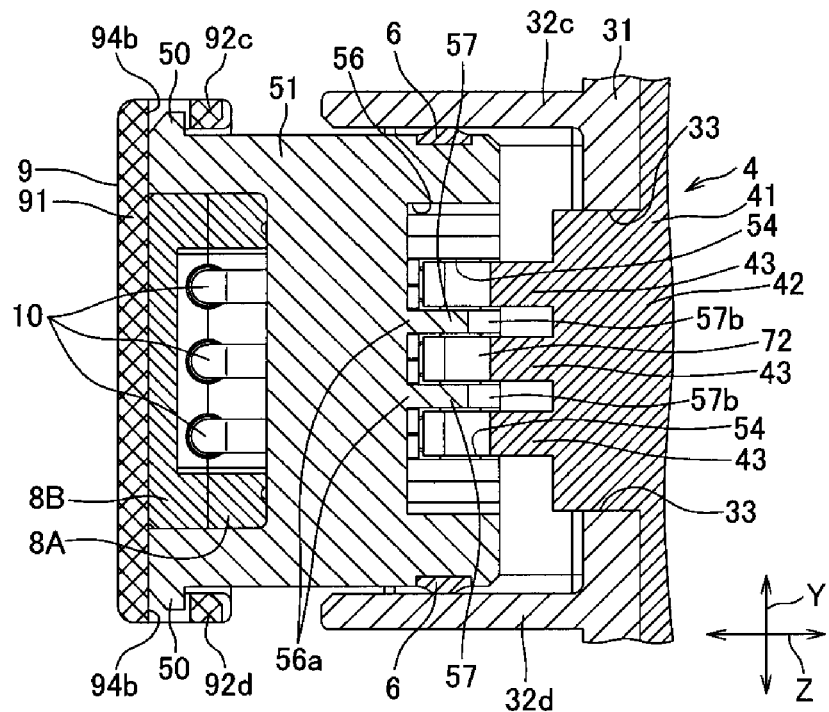
FIG. 7 is an enlarged view of main parts shown in FIG. 6.
Figure 10:
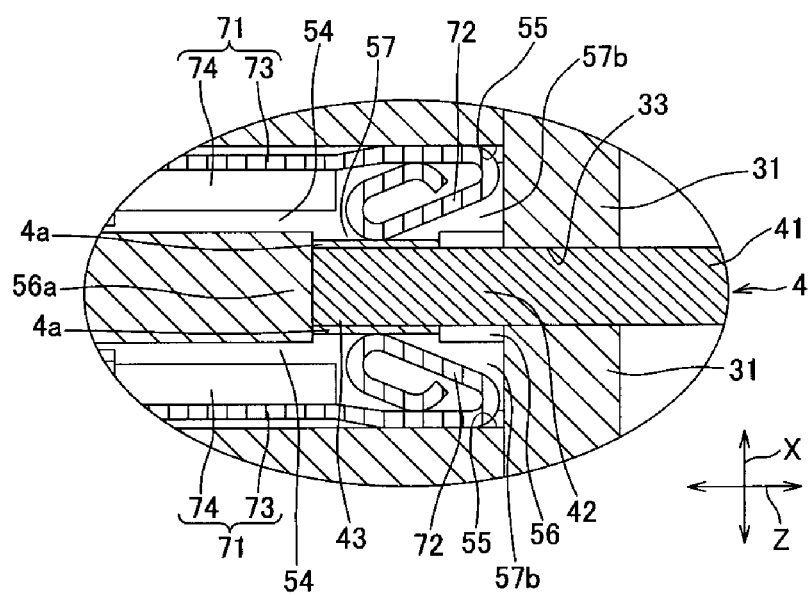
FIG. 10 is an enlarged view of main parts shown in FIG. 9.
Figure 11:
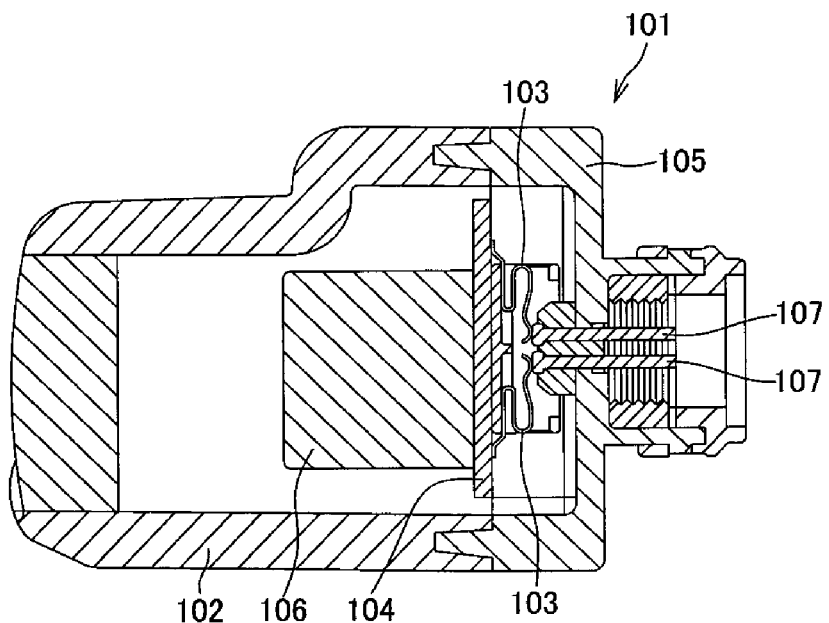
FIG. 11 is a perspective view of a CCD camera unit of the prior art.
Figure 12:
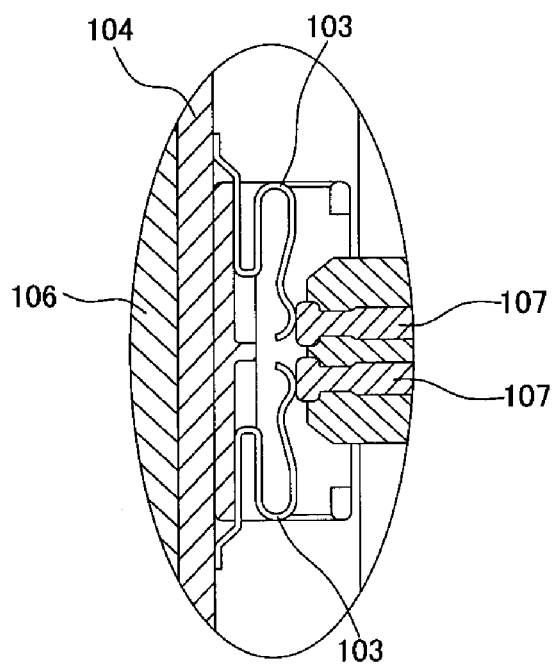
FIG. 12 is an enlarged view of main parts shown in FIG. 11.

As shown in FIGS. 7 and 10, the through-holes 54 are arranged in a pair (two) in the arrow X direction and the three through-holes 54 are arranged in the arrow Y direction. Also, the through-holes 54 are provided at an interval each other. Also, each through-hole 54 penetrates the housing main body 51 in the arrow Z direction.

The contact sections 55 are provided at sides, which are distant from the circuit board 4 in the arrow X direction of the pair of spring members 72, and are provided in plural (pairs) at positions sandwiching the pair of spring members 72 between the contact sections. That is, each pair of contact sections 55 is provided to face each other in a direction that the pair of spring members 72 gets away from each other along the arrow X direction. Also, in the shown example, the plurality of contact sections 55 is provided in a pair (two) in the arrow X direction and the three contact sections are provided in the arrow Y direction. Also, the contact sections 55 are provided on the inner surfaces of the through-holes 54 in the arrow X direction, and at end portions of the housing main body 51 facing the connection connector 3 in the arrow Z direction. The plurality (pairs) of contact sections 55 restrains the spring members 72 from moving in a direction getting away from the circuit board 4 along the arrow X direction.

Figure 6:
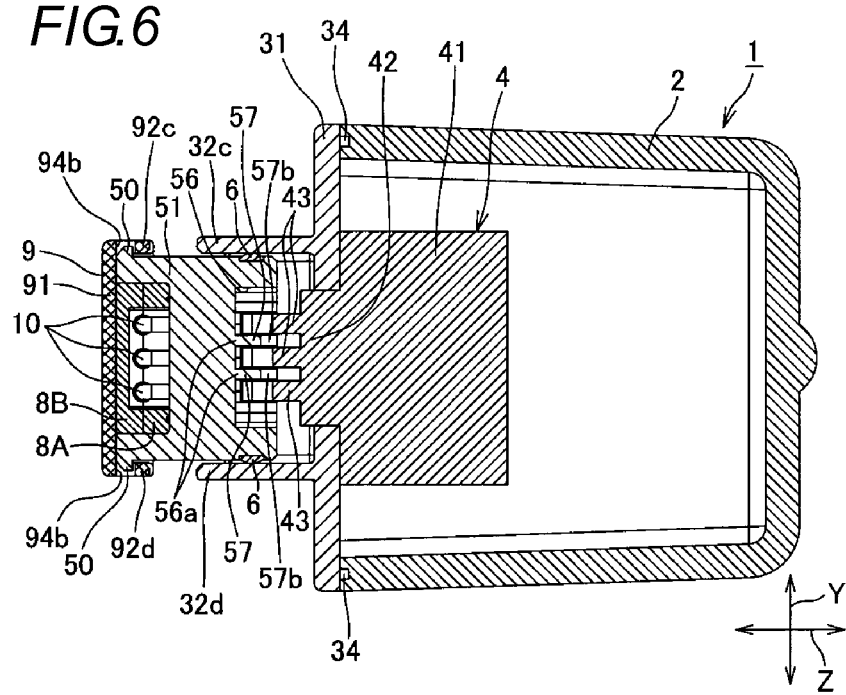
FIG. 6 is a sectional view showing a state where a rib of the female housing is introduced between a plurality of terminal sections of a circuit board configuring the CCD camera unit shown in FIG. 1.

As shown in FIGS. 6 and 7, the substrate housing section 56 has a shape that is concave from a surface of the housing main body 51 facing the connection connector 3 in the arrow Z direction, and houses the terminal sections 43 and a part of the press fitting section 42 of the circuit board 4, which protrude from the plate section 31 of the connection connector 3. Also, the substrate housing section 56 extends in the arrow Y direction. Also, the plurality of through-holes 54a and the substrate housing section 56 communicate with each other.

The ribs 57 protrude, along the arrow Z direction, from bottom sections 56a of the substrate housing section 56 in the arrow Z direction. Also, the plurality of ribs 57 is provided in the arrow Y direction so that side surfaces thereof face each other at an interval. Also, an end portion (i.e., end portion of the rib 57 at the connection connector 3-side) of the rib 57 distant from the bottom section 56a of the substrate housing section 56 in the arrow Z direction is positioned at an inner side (side distant from the connection connector 3) of a surface of the housing main body 51 at the connection connector 3-side. Also, the rib 57 is provided with a pair of restraint sections 57b protruding from the end portion of the rib 57 towards the circuit board 4 in the arrow Z direction.

The pair of restraint sections 57b is provided at both end portions of the rib 57 in the arrow X direction. The pair of restraint sections 57b restrains a position of the circuit board 4 in the arrow X direction between the pair of restraint sections 57b.

The first packing mounting section 58 has a shape that is recessed from the surface of the housing main body 51 overlapping the plurality of wall sections 32a, 32b, 32c, 32d having a frame shape on the connection connector 3. Also, the first packing mounting section 58 is provided at an end portion of the housing main body 51 facing the connection connector 3 in the arrow Z direction. Also, the first packing mounting section 58 is provided over the entire periphery of the housing main body 51.

The pair of sections to be engaged 59 is formed in convex shape from surfaces of the housing main body 51, which overlap with the wall sections 32a, 32b having the engaging sections 35 provided thereon, towards directions getting away from each other along the arrow X direction. Also, each section to be engaged 59 is configured to be elastically deformable in the arrow X direction. Also, each section to be engaged 59 is provided between the first packing mounting section 59 and the protrusion 52 that will be described later.

Each protrusion 52 has a plate shape. Also, the pair of protrusions 52 is provided at end portions of the housing main body 51 distant from the connection connector 3 in the arrow Z direction. Also, the pair of protrusions 52 is formed in convex shape from the surfaces of the housing main body 51 towards directions getting away from each other along the arrow X direction. Each protrusion 52 is provided over an entire length of the housing main body 51 in the arrow Y direction. Also, each protrusion 52 continues from the housing main body 51 at one end portion thereof in the arrow Z direction, and the other end portion of each protrusion 52 continues to a holder mounting section 53. The protrusions 52 contact the wall sections 32a, 32b of the connection connector 3 at end portions thereof facing the connection connector 3 in the arrow Z direction and contact sidewall sections 92a, 92b of the rear holder 9 (which will be described later) at end portions thereof distant from the connection connector 3 in the arrow Z direction.

The holder mounting sections 53 are provided at end portions of the female housing 5 distant from the connection connector 3 in the arrow Z direction. That is, the holder mounting sections 53 continue from the end portions of the housing main body 51 distant from the connection connector 3. Also, the holder mounting sections 53 are provided at both end portions of the housing main body 51 in the arrow Y direction and are provided to stand from the end portions of the housing main body 51 in the arrow Z direction. Also, the holder mounting sections 53 are provided over the entire length of the housing main body 51 in the arrow X direction. Also, the holder mounting sections 53 are provided with engaging sections 50, respectively, which are engaged to the rear holder 9.

A pair of the engaging sections 50 is provided at end portions of the holder mounting sections 53 distant from the connection connector 3 in the arrow Z direction. The pair of engaging sections 50 protrudes towards a direction along which the engaging sections get away from surfaces of the holder mounting sections 53.

The first packing 6 has a frame shape and is made of synthetic resin having flexibility such as rubber, for example. Also, the first packing 6 is formed to be elastically deformable in both directions along which a diameter thereof is reduced (which means that inside and outside diameters are reduced) and the diameter is enlarged. Also, the first packing 6 is mounted to the female housing 5. When the female housing 5 is mounted to the connection connector 3, the first packing 6 is positioned between the female housing 5 and the connection connector 3, so that the first packing prevents liquid such as water from being introduced to the circuit board 4.

The second packing 8 is made of synthetic resin having flexibility such as rubber, for example. Also, as shown in FIGS. 3 and 4, the second packing 8 is mounted to the female housing 5 with the female terminals 7 being mounted to the second packing 8, so that the second packing prevents the liquid such as water from being introduced into the through-holes 54 and the substrate housing section 56 of the female housing 5. Also, the second packing 8 has a pair of holding sections 8A, 8B holding the electric wires 10 therebetween and a hinge 84 connecting the pair of holding sections 8A, 8B.

The pair of holding sections 8A, 8B has a frame shape, respectively. The pair of holding sections 8A, 8B overlap with each other at inner surfaces thereof.

The holding section 8A has an opening 82 through which the female terminals 7 pass and placing portions 83 on which the electric wires 10 are placed. The opening 82 penetrates the holding section 8A in the arrow Z direction. Also, the opening 82 is provided at a central portion of the holding section 8A. The placing portions 83 are provided on the inner surface of the holding section 8A. Also, the plurality of (three, in the shown example) placing portions 83 is provided at an interval in the arrow Y direction. Each placing portion 83 is a recess that is concave from the inner surface of the holding section 8A and extends in the arrow X direction. Also, the placing portion 83 is provided with a plurality of protrusions 83a protruding from a bottom section of the concave shape of the placing portion 83. The protrusions 83a is provided at an interval.

The holding section 8B is provided with placing portions 83 positioning the electric wires 10 between the placing portions and the placing portions 83 of the holding section 8A. The placing portion 83 has a shape that is concave from the inner surface of the holding section 8B.

The rear holder 9 includes a plate-shaped cover section 91 overlapping with the holding section 8B of the second packing 8 and a plurality of sidewall sections 92a, 92b, 92c, 92d provided to stand from edges of the cover section 91 towards the second packing 8 along the arrow Z direction, and has a cylindrical shape having a bottom.

Among the plurality of sidewall sections 92a, 92b, 92c, 92d, a pair of the sidewall sections 92a, 92b facing each other in the arrow X direction is provided with a plurality of notched portions 93. The notched portions 93 are notched in a concave shape from end portions of the sidewall sections 92a, 92b distant from the cover section 91 in the arrow Z direction towards the cover section 91. The notched portions 93 are provided at positions corresponding to the placing portions 83 of the second packing 8 and are formed in plural (three, in the shown example) at an interval in the arrow Y direction.

Among the plurality of sidewall sections 92a, 92b, 92c, 92d, a pair of the sidewalls 92c, 92d facing each other in the arrow Y direction is provided with sections to be engaged 94, which are engaged with the engaging sections 50 of the female housing 5, respectively.

The section to be engaged 94 has a pair of slits 94a and a hole 94b provided between the pair of slits 94a. The pair of slits 94a is provided at an interval in the arrow X direction. Also, the respective slits 94a are linearly notched from end portions of the sidewall sections 92c, 92d, which are distant from the cover section 91 in the arrow Z direction, towards the cover section 91. The hole 94b penetrates each of the sidewall sections 92c, 92d. The section to be engaged 94 is formed with the pair of slits 94a, so that the sections to be engaged is elastically deformable in the direction getting away from each other along the arrow Y direction.

The CCD camera 1 is assembled as follows.

First, the core at the terminal of the electric wire 10, which is exposed as the sheath of the electric wire 10 is stripped, is placed on the bottom plate 73 of the electric wire connection section 71 of the female terminal 7 and the core crimping piece 74 is crimped to approach the bottom plate 73. Thereby, the female terminal 7 is mounted to the electric wire 10. The electric wires 10 having the female terminals 7 mounted thereto are made to pass through the opening 82 of the holding section 8A and are bent into the L shape, so that the female terminals 7 and the electric wires 10 having the female terminals 7 mounted thereto are held between the placing portions 83 of the holding sections 8A, 8B of the second packing 8. By doing so, the female terminals 7 and the electric wires 10 having the female terminals 7 mounted thereto are mounted to the second packing 8. Then, the electric wires 10 and the female terminals 7 having the second packing 8 mounted thereto are made to pass through the through-holes 54 from the holder mounting sections 53 of the female housing 5, so that the second packing 8 is made to overlap with the female housing 5. After that, the cover section 91 of the rear holder 9 is approached to overlap with the holding section 8B of the second packing 8. Thereby, the engaging sections 50 of the female housing 5 are engaged to the sections to be engaged 94 of the rear holder 9. At this time, the sidewall sections 92a, 92b of the rear holder 9 contact the pair of protrusions 52 of the female housing 5. The rear holder 9 is mounted to the female housing 5 as described above, so that the electric wires 10 and the female terminals 7 are mounted to the female housing 5 via the second packing 8.

Then, the camera lens device (not shown) is connected to the wiring pattern 4a of the circuit board 4. By doing so, the camera lens device is mounted on the circuit board 4. The circuit board 4 having the camera lens device mounted thereon is moved in the arrow Z direction to thus press-fit the press-fitting section 42 of the circuit board 4 into the opening 33 of the connection connector 3, so that the circuit board 4 is mounted to the connection connector 3.

Figure 8:
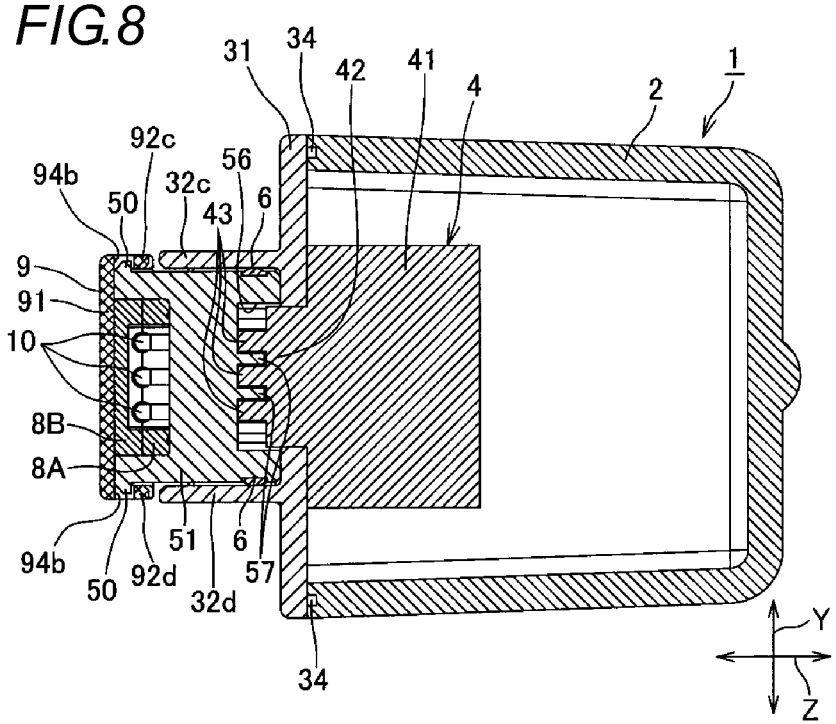
FIG. 8 is a sectional view taken along a line I-I of FIG. 1.
Figure 9:
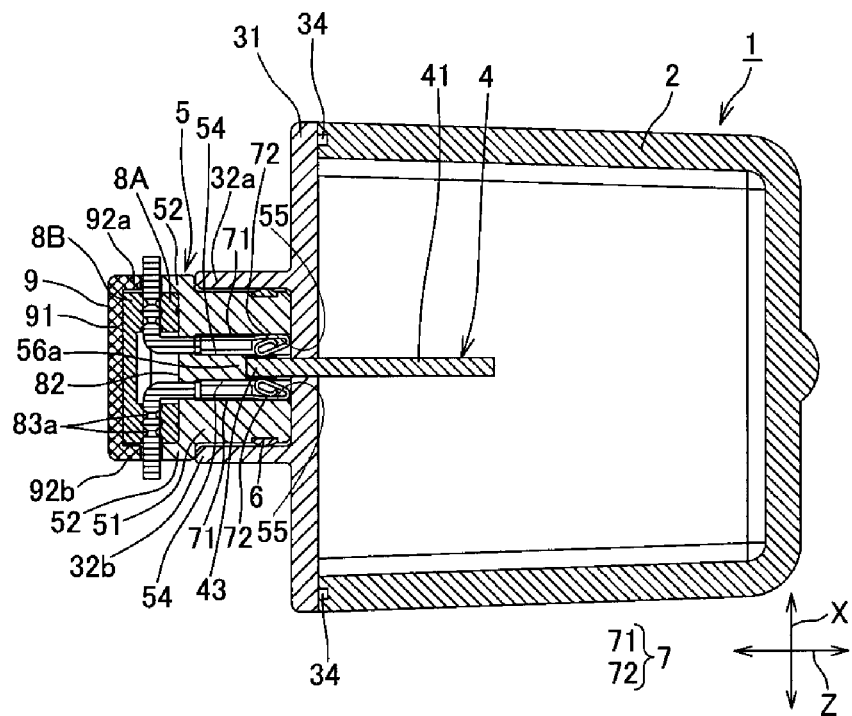
FIG. 9 is a sectional view taken along a line II-II of FIG. 1.

Then, the first packing 6 is mounted to the first packing mounting section 58 of the female housing 5 having the electric wires 10 and the female terminals 7 mounted thereto via the second packing 8. Then, the female housing 5 is made to come close to the wall sections 32a, 32b, 32c, 32d of the connection connector 3. Thereby, the engaging sections 35 of the connection connector 3 are engaged to the sections to be engaged 59 of the female housing 5. At this time, the wall sections 32a, 32b of the connection connector 3 contact the pair of protrusions 52 of the female housing 5. Also, as shown in FIGS. 6 and 7, as the circuit board 4 is moved (introduced) between the pair of female terminals 7 in the arrow Z direction, each terminal section 43 is introduced into the substrate housing section 56 of the female housing 5, and as shown in FIG. 8, the ribs 57 are introduced between the terminal sections 43 in the arrow Y direction and the pair of spring members 72 positions each terminal section 43 therebetween in the arrow X direction. By doing so, the pair of spring members 72 elastically contacts the wiring pattern 4a formed on the respective terminal sections 43, so that the respective female terminals 7 and the circuit board 4 are electrically connected. At this time, as shown in FIGS. 9 and 10, the pair of spring members 72 is positioned between the pair of contact sections 55. Also, at this time, a position of the circuit board 4 in the arrow X direction is restrained between the pair of restraint sections 57b of the female housing 5. Finally, the plate section 31 of the connection connector 3 to which the female housing 5 having the electric wires 10 and the female terminals 7 mounted thereto is mounted is approached to thus cover the opening of the camera case 2. Thereby, the protrusion 34 of the connection connector 3 is fitted into the recess 22 of the camera case 2, so that the camera case 2 and the connection connector 3 are mounted each other. By doing so, the CCD camera unit 1 is assembled.

According to the above illustrative embodiment, the CCD camera unit 1 that is an electronic component includes the circuit board 4, the female terminals 7 that are at least one pair of connection terminals connected to the circuit board 4 and the female housing 5 that is the housing having the pair of female terminals 7 mounted thereon. The circuit board 4 is provided with the plurality of terminal sections 43 that is formed in convex shape towards the female housing 5, is provided at an interval and is connected to the connection terminals 7. Each of the pair of female terminals 7 is provided with the spring members 72 that are formed to be elastically deformable in both directions (arrow X direction) along which the pair of female terminals 7 comes close to each other and gets away from each other and that sandwich the terminal sections 43 therebetween. The female housing 5 is provided with at least one rib 57 that is provided between the through-holes 54 through which each of the pair of female terminals 7 pass, that is formed in convex shape towards the circuit board 4 from the bottom section 56a of the substrate housing section 56 in which the circuit board 4 is housed and that is positioned between the plurality of terminal sections 43. Therefore, for example, when the CCD camera unit 1 vibrates during the traveling of the vehicle, the spring members 72 are elastically deformed to thus apply the contact load to the circuit board 4, so that the stable contact reliability between the circuit board 4 and the female terminals 7 connected to the circuit board 4 is maintained. Also, the ribs 57 are provided, so that the circuit board 4 is restrained from moving in the direction (arrow Y direction) intersecting (orthogonal) with both the direction (arrow X direction) along which the spring members 72 are elastically deformed and the direction (arrow Z direction) along which the circuit board 4 is introduced between the pair of female terminals 7. Thereby, the positional deviation between the female terminals 7 mounted to the female housing 5 and the circuit board 4 is restrained. Therefore, even when the CCD camera 1 vibrates in the direction (arrow X direction) along which the spring members 72 are elastically deformed or in the intersecting (orthogonal) direction (arrow Y direction), the stable contact reliability between the circuit board 4 and the female terminals 7 connected to the circuit board 4 is maintained. Hence, it is possible to provide the CCD camera unit 1 in which the connected state between the circuit board 4 and the female terminals 7 is favorably maintained.

Also, since the spring members 72 provided to each of the pair of female terminals 7 sandwich the terminal sections 43 (i.e., circuit board 4) therebetween, the pair of spring members 72 and the circuit board 4 overlap with each other. Thereby, it is possible to lower (i.e., miniaturize) the height of the CCD camera unit 1 in the direction (arrow Z direction) along which the circuit board 4 is introduced between the pair of female terminals 7.

Also, the female housing 5 is provided with the pair of contact sections 55 that is provided in the direction along which the pair of spring members 72 gets away from each other in the arrow X direction and that sandwiches the pair of spring members 72 therebetween. Hence, the spring members 72 are brought into contact with the contact sections 55, so that the spring members 72 are restrained from moving in the direction along which the spring members separate from the circuit board 4. Thereby, it is possible to maintain the connected state between the circuit board 4 and the female terminals 7 more favorably.

Also, the pair of restraint sections 57b is provided which is formed in convex shape from the rib 57 towards the circuit board 4 and positions the circuit board 4 therebetween. Thus, the circuit board 4 is brought into contact with the pair of restraint sections 57b, so that the circuit board 4 is restrained from moving in the direction (arrow X direction) along which the spring members 72 are elastically deformed. Thereby, the stable contact reliability between the circuit board 4 and the female terminals 7 connected to the circuit board 4 is maintained, so that it is possible to maintain the connected state between the circuit board 4 and the female terminals 7 more favorably.

In the meantime, according to the above illustrative embodiment, the press fitting section 42 of the circuit board 4 is press-fitted into the opening 33 of the connection connector 3, so that the circuit board 4 is mounted to the connection connector 3. However, the invention is not limited thereto. For example, the circuit board 4 may be insert-molded to the connection connector 3 and thus mounted thereto.

Also, according to the above illustrative embodiment, the plurality (pair) of female terminals 7 serving as the connection terminals is provided. However, the invention is not limited thereto. For example, at least one pair of female terminals 7 may be provided.

Also, according to the above illustrative embodiment, the plurality of ribs 57 is provided. However, the invention is not limited thereto. For example, at least one rib 57 may be provided.

Also, the above illustrative embodiment shows a representative embodiment of the invention and the invention is not limited thereto. That is, a variety of modifications can be made without departing from the gist of the invention.

This application is based on Japanese Patent Application No. 2010-093347 filed on Apr. 14, 2010, the disclosures of which are incorporated herein by reference.

INDUSTRIAL APPLICABILITY

According to the electronic component of the invention, even when the electronic component vibrates during the traveling of the vehicle and even when the electronic component vibrates in the direction along which the spring members are elastically deformed or in the intersecting (orthogonal) direction, the stable contact reliability between the circuit board and the connection terminals connected to the circuit board is maintained. Thereby, it is possible to favorably maintain the connected state between the circuit board and the connection terminals.

DESCRIPTION OF REFERENCE NUMERALS

1: CCD camera unit (electronic component)
4: circuit board
5: female housing (housing)
07: female terminal (connection terminal)
43: terminal section
54: through-hole
55: contact section
56: substrate housing section
56a: bottom section
57: rib
57b: restraint section
72: spring member Arrow X: direction along which a pair of spring members comes close to each other and get away from each other

The invention claimed is:

1. An electronic component comprising:
a circuit board;
at least a pair of connection terminals connected to the circuit board along a first direction which is an insertion direction; and
a housing to which the pair of connection terminals are mounted,
wherein the circuit board is provided with a plurality of terminal sections that are formed in convex shape projecting outwards from the circuit board towards the housing in the first direction, provided at an interval and connected to the connection terminals,
wherein each of the pair of connection terminals is provided with spring members that are formed to be elastically deformable, such that the pair of connection terminals move close to each other and move away from each other and sandwich the terminal sections therebetween,
wherein the housing is provided with a substrate housing section that is disposed between through-holes, through which the respective connection terminals are inserted into in the first direction, and said substrate housing section houses the circuit board therein, and
wherein the housing is provided with at least one rib that is formed in convex shape from a bottom section of the substrate housing section along the first direction towards the circuit board and is introduced into the plurality of terminal sections, wherein a pair of restraint sections is provided which is formed in convex shape from the rib to be further protruded along tile first direction towards the circuit board and positions the circuit board therebetween.

2. The electronic component according to claim 1, wherein the housing is provided with a pair of contact sections that is provided to face each other in the direction along which the pair of spring members get away from each other and that sandwich the pair of spring members therebetween.

* * * * *